United States Patent
Ariki

(10) Patent No.: US 8,076,911 B2
(45) Date of Patent: Dec. 13, 2011

(54) FLASH MEMORY AND RELATED VOLTAGE REGULATOR

(75) Inventor: Takuya Ariki, Yokohama (JP)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 754 days.

(21) Appl. No.: 12/144,769

(22) Filed: Jun. 24, 2008

(65) Prior Publication Data
US 2009/0001950 A1   Jan. 1, 2009

(30) Foreign Application Priority Data
Jun. 25, 2007   (JP) .................. 2007-166684

(51) Int. Cl.
*G05F 1/70*  (2006.01)
*G05F 1/40*  (2006.01)

(52) U.S. Cl. ......... 323/209; 323/298; 323/353; 365/226

(58) Field of Classification Search .......... 323/273–276, 323/280, 297, 298, 208–210, 352, 353; 365/226
See application file for complete search history.

(56) References Cited

U.S. PATENT DOCUMENTS

| | | | | |
|---|---|---|---|---|
| 5,568,083 A * | 10/1996 | Uchiyama et al. | ............. | 327/538 |
| 5,596,465 A * | 1/1997 | Honda et al. | .................... | 361/18 |
| 6,304,111 B1 * | 10/2001 | Pirjaberi | ........................ | 327/112 |
| 7,894,236 B2 * | 2/2011 | Oh et al. | ........................ | 365/148 |

FOREIGN PATENT DOCUMENTS

KR   2003-150251   5/2003

* cited by examiner

*Primary Examiner* — Jessica Han
(74) *Attorney, Agent, or Firm* — Volentine & Whitt, PLLC

(57) ABSTRACT

A voltage regulator includes a voltage regulator unit configured to output a step voltage and a damping resistance switching unit coupled between a load and an output node of the voltage regulator and configured to select an optimal damping resistance value based on a required load capacity.

14 Claims, 5 Drawing Sheets

FLASH MEMORY AND RELATED VOLTAGE REGULATOR

CROSS-REFERENCE TO RELATED APPLICATIONS

This U.S. non-provisional patent application claims priority under 35 U.S.C §119 to Japanese Patent Application No. 2007-166684 filed Jun. 25, 2007, the subject matter of which is hereby incorporated by reference.

SUMMARY

The present invention relates generally to semiconductor memory devices. More particularly, the invention relates to flash memory type semiconductor memory devices and a constituent voltage regulator.

In one embodiment, the invention provides a voltage regulator comprising; a voltage regulator unit configured to output a stepped voltage at an output node, and a damping resistance switching unit connected between a load and the output node of the voltage regulator unit, and configured to select a variable damping resistance value based on a required capacity for the load.

In other embodiments, the invention provides a flash memory device or and computational logic system incorporating a similar voltage regulator.

DESCRIPTION OF EMBODIMENTS

Figure 3:
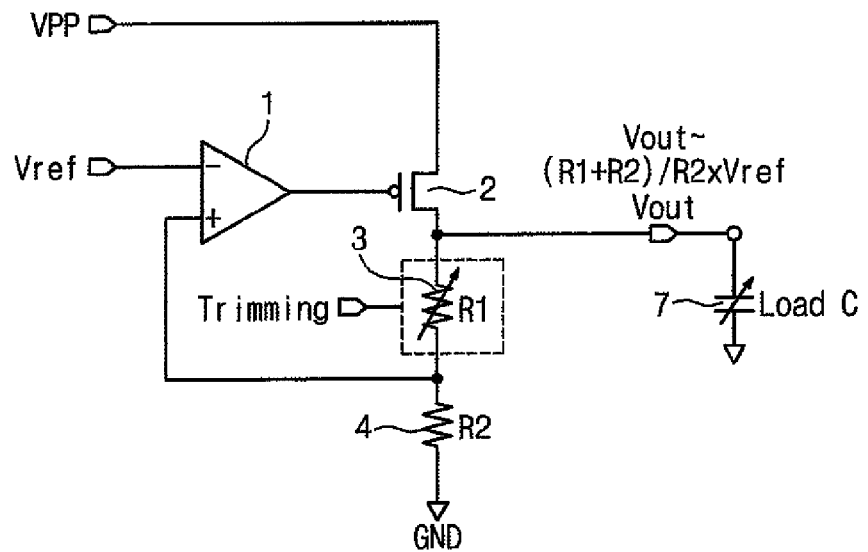
FIG. 3 is a circuit diagram of a conventional voltage regulator.

Selected embodiments of the invention will be described in relation to several comparative examples of conventionally implemented voltage regulators adapted for use in semiconductor memory devices. For example, in a NOR-type flash memory device, a step voltage is applied as a wordline driving voltage during a program operation. FIG. 3 is a circuit diagram of a conventional voltage regulator. Referring to FIG. 3, an inverting input terminal of an operational amplifier 1 is connected to a reference voltage Vref. A non-inverting input terminal of operational amplifier 1 is connected to a node disposed between a first resistance setting a driving voltage (hereinafter referred to as "driving voltage setting resistance 4") and a second resistance for trimming the driving voltage (hereinafter referred to as "driving voltage trimming resistance 3"). The output of operational amplifier 1 is connected to the gate of a PMOS driving transistor 2.

Driving voltage setting resistance 4 is also connected to ground GND. Driving voltage trimming resistance 3 is connected between the node and the drain of PMOS driving transistor 2 which is connected to an output terminal Vout. The source of PMOS driving transistor 2 is connected to a high-voltage write power VPP, and the output terminal Vout thereof is connected to a load capacitor 7.

Driving voltage trimming resistance 3 is controlled by a trimming signal to be set to a fixed value. That voltage apparent at the node between first and second resistances 3 and 4 fluctuates on a step by step basis as it serves as an output feedback signal for operational amplifier 10. Thus, a stepped driving voltage of $\{[R1+R2]/R1] \cdot Vref\}$ is apparent at the output terminal Vout, where the R1 and R2 are, respectively, the values of first and second resistances 3 and 4.

Figure 4:
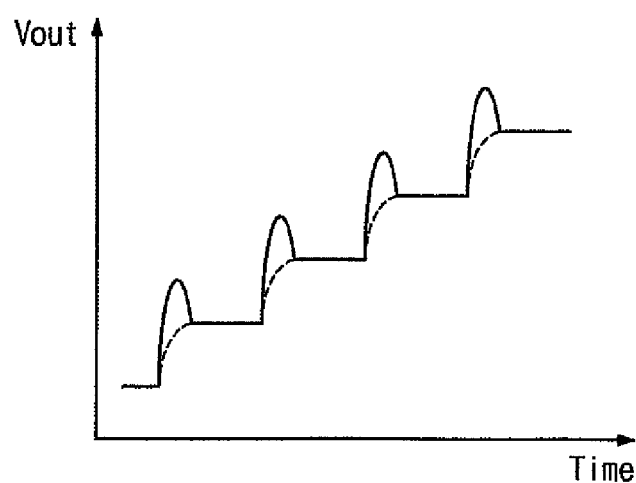
FIG. 4 is a waveform diagram of a driving voltage provided by a conventional voltage regulator.

Unfortunately, the driving voltage encounters stability problems associated with the feedback circuit controlling operational amplifier 1. For this reason, the so-called "edge portion" of the stepped output voltage often exhibits a voltage overshoot. FIG. 4 is a waveform diagram illustrating the resulting driving voltage having such an overshoot, as provided by a conventional voltage regulator. That is, in FIG. 4, the solid line represents the actual driving voltage waveform provided by the conventional voltage regulator while the dotted line represents an ideal driving voltage waveform.

Figure 5:
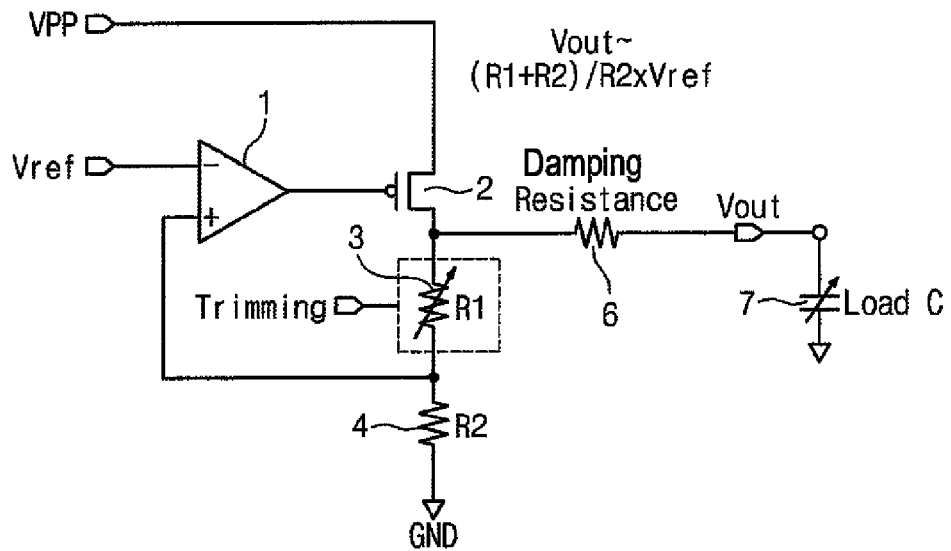
FIG. 5 is a circuit diagram of another conventional voltage regulator having a damping resistance.

Recognizing the driving voltage overshoot inherent in the conventional circuit illustrated in FIGS. 3 and 4, certain voltage regulators have incorporated an additional damping resistance to limit or eliminate the overshoot. FIG. 5 is a circuit diagram illustrating a conventional voltage regulator having a damping resistance 6 connected between the output terminal Vout and a node between driving voltage trimming resistance 3 and the drain of PMOS driving transistor 2.

When the output voltage of the voltage regulator illustrated in FIG. 5 is used as a driving voltage for a NOR flash memory device, a value of damping resistance 6 is set in such a manner to optimized the load placed on a wordline during certain operating modes such as write and erase. However, the number of wordlines that must be collectively driven during the final testing of a constituent semiconductor memory device (i.e., during a test mode) must be much greater than during normal operating modes. Thus, during the test mode the load to be driven is much higher than during normal operating modes. Because of this test mode practicality requirement, a load optimized for use during normal operating modes may not properly serve during a test mode and vice verses (i.e., the driving voltage output may not reach a defined value within predetermined period of time).

Figure 6:
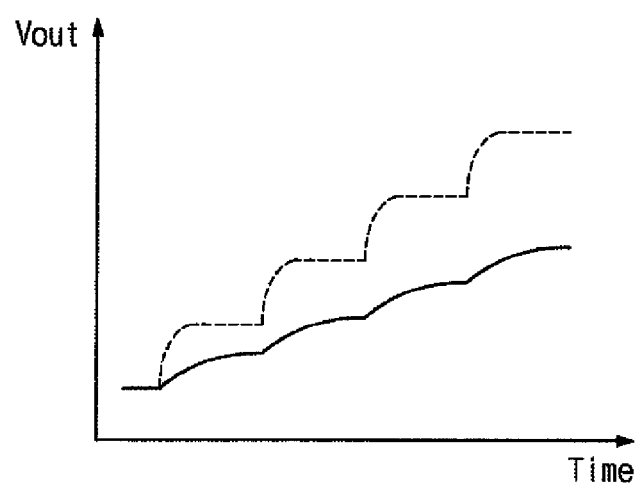
FIG. 6 is a waveform diagram of a driving voltage provided by the conventional voltage regulator having the damping resistance.

FIG. 6 is a waveform diagram illustrating a driving voltage for a conventional voltage regulator having a damping resistance. In FIG. 6, the dotted line represents a driving voltage waveform during normal operating modes, (i.e., a properly optimized driving voltage output), but the a solid line represents a corresponding driving voltage waveform during a test mode.

In the context of the foregoing discussion, one example of a damping resistance switching unit is disclosed in Japanese Patent Publication No. 2003-150251. The switching circuit disclosed in the document dynamically decreases he value of the damping resistance when current is first applied. Later in the application of current, the switching circuit dynamically increases the value of the damping resistance to allow the current to rise quickly.

Embodiments of the invention will now be described with reference to the accompanying drawings. This invention may, however, be variously embodied and should not be construed as being limited to only the illustrated embodiments. Rather, these embodiments are presented as teaching examples.

Throughout the written description and drawings, like reference numbers and indicators refer to like or similar elements.

Figure 1:
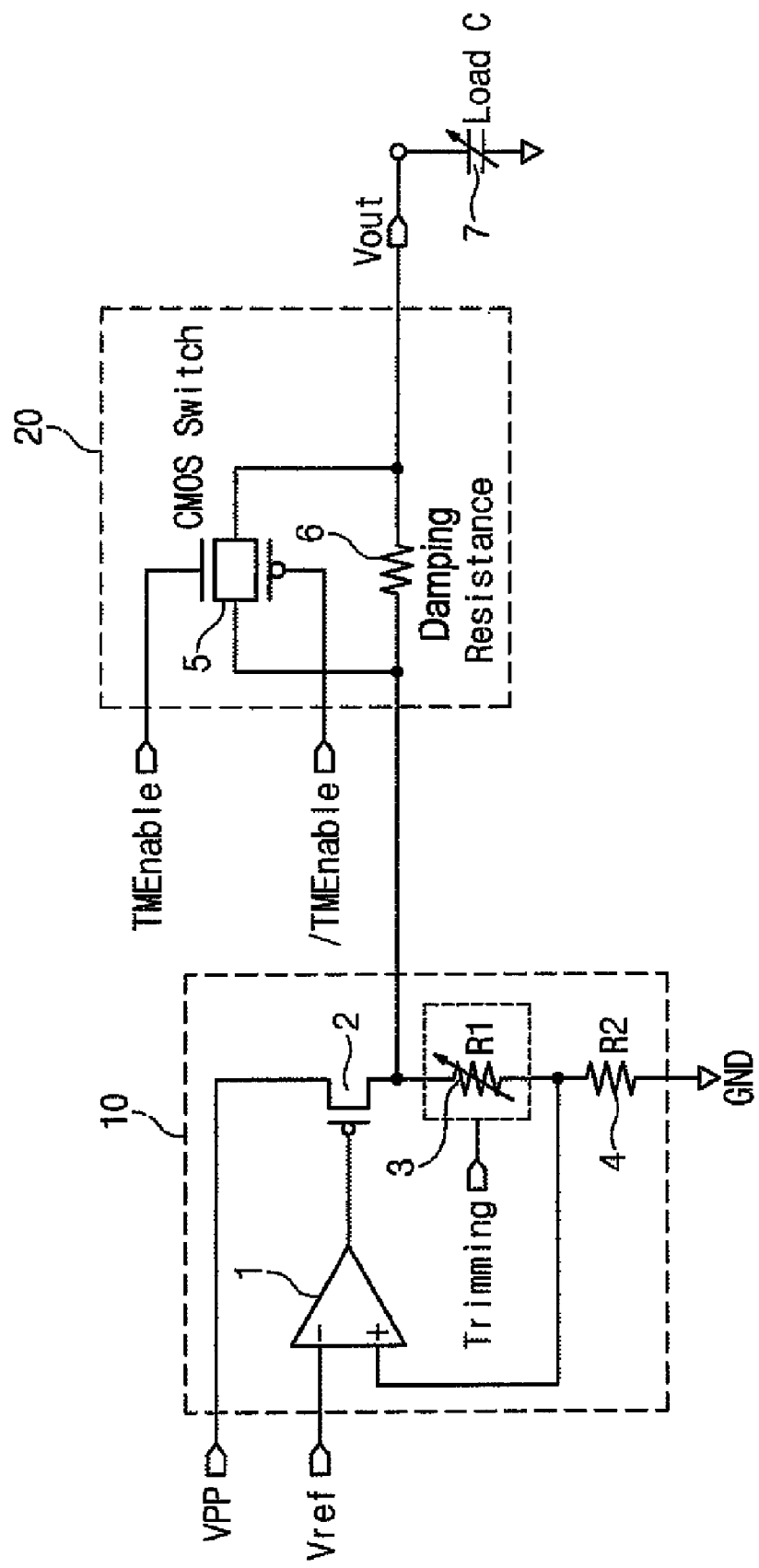
FIG. 1 is a circuit diagram of a voltage regulator according to an embodiment of the invention.

FIG. 1 is a circuit diagram of a voltage regulator according to an embodiment of the invention. Referring to FIG. 1, a voltage regulator unit 10 includes an operational amplifier 1, a PMOS driving transistor 2, a driving voltage trimming resistance 3, and a driving voltage setting resistance 4. Voltage regulator unit 10 also includes a damping resistance switching unit 20 that includes a damping resistance 6 and a CMOS transistor switch 5 which are coupled in parallel. The gate of the NMOS transistor forming CMOS transistor switch 5 is connected to a first control signal TMEnable, and the gate the PMOS transistor forming CMOS transistor 5 is connected to a second control signal /TMEnable.

During normal operating modes, the first control signal TMEnable is logically "low" while the second control signal /TMEnable is logically "high". Under these bias conditions, CMOS transistor switch 5 is turned OFF. Since the driving voltage is provided to load 7 within voltage regulator 10 after passing through damping resistance 6, any voltage overshoot will be suppressed. As a result, a voltage waveform very much like the ideal (dotted line) representation of FIG. 6 may be obtained.

However, during a test mode requiring a higher load capacity, the first control signal TMEnable is high while the second control signal /TMEnable is low. Thus, CMOS transistor switch 5 is turned ON, thereby forming a bypass signal line around damping resistance 6. Due to the presence of this bypass signal line around damping resistance 6 its resistive effect is all but eliminated. For this reason, a driving voltage having a relatively smooth up-ramping characteristic is obtained despite the high load capacity requirement. As a result, a voltage waveform similar to represented by the solid line of FIG. 6 may be obtained.

Figure 2:
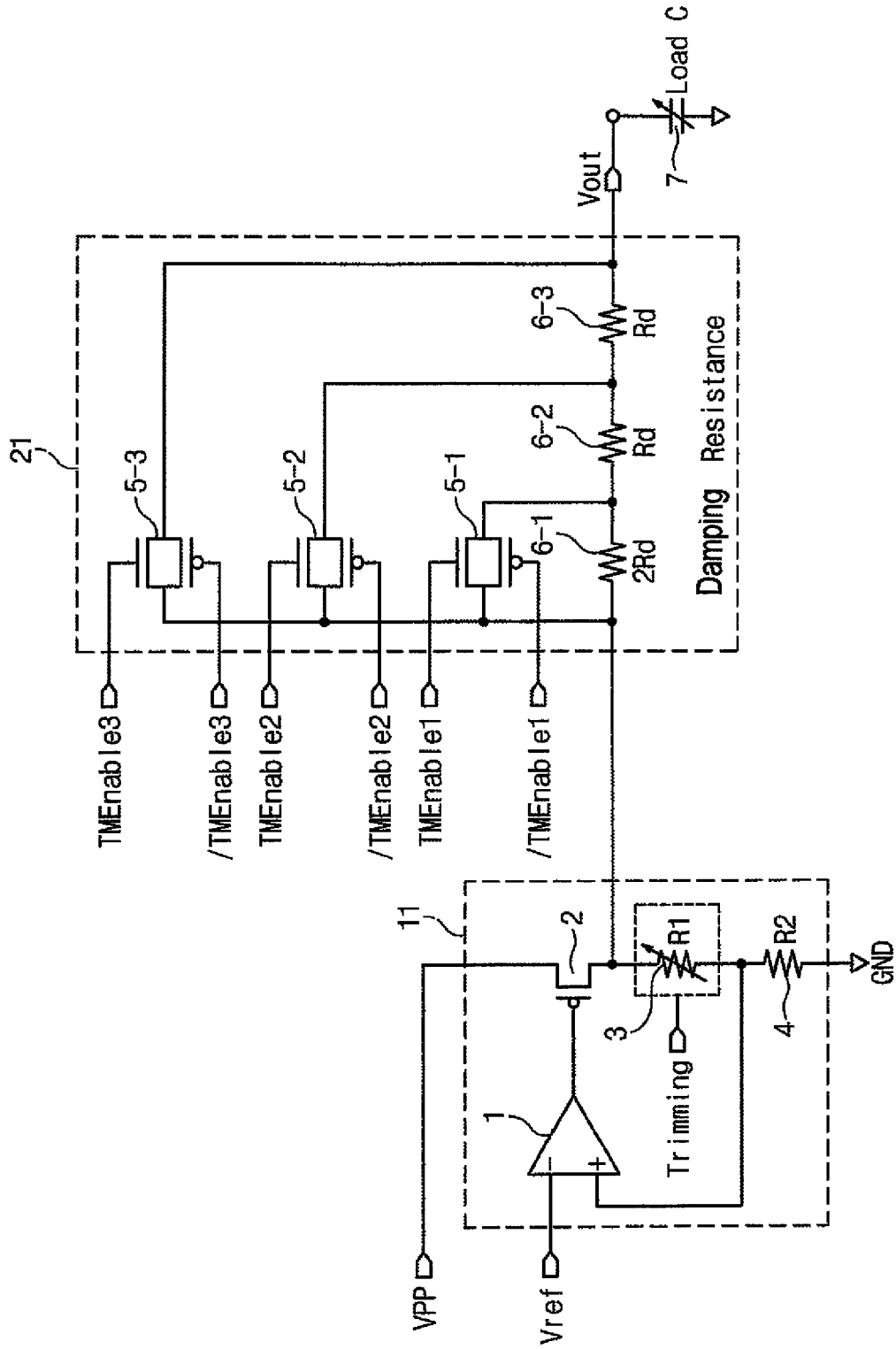
FIG. 2 is a circuit diagram of a voltage regulator according to another embodiment of the invention.

FIG. 2 is a circuit diagram of a voltage regulator according to another embodiment of the invention. Referring to FIG. 2, a damping resistance switching unit 21 includes a plurality of series connected damping resistances 6-1, 6-2, and 6-3, instead of the single damping resistance 6 shown in FIG. 1. A first CMOS transistor switch 5-1 is connected in parallel across a first damping resistance 6-1. A second CMOS transistor switch 5-2 is connected in parallel across a second damping resistances 6-2 and the first CMOS transistor switch 6-2. A third CMOS transistor switch 5-3 is connected in parallel across first through third damping resistances 6-1, 6-2, and 6-3. The respective gates of the NMOS transistor sides for the plurality of CMOS transistor switches 5-1, 5-2, and 5-3 are connected to first through third control signals TMEnable1, 2, and 3. The gates of the PMOS transistor sides of the plurality of CMOS transistor switches 5-1, 5-2, and 5-3 are connected to fourth through sixth control signals /TMEnable1, 2, and 3. In the illustrated example, first and fourth, second and fifth, and third and sixth control signals are logical complements forming first through third complementary control signals respectively applied to first through third CMOS transistor switches 5-1, 5-2, and 5-3. In the illustrated example, the value(s) of the damping resistances 6-1, 6-2, and 6-3 are, respectively, 2Rd, Rd, and Rd.

According to the foregoing embodiment, a four-step switching approach to the damping resistance applied to the driving voltage output may be achieved. For example, during an operating mode requiring a low output load, first through third control signals TMEnable1, 2, and 3 are all turned OFF while complementary control signals /TMEnable1, 2, and 3 are turned ON. Thus, the plurality of CMOS transistor switches 5-1, 5-2, and 5-3 are all turned ON. In this case, a damping resistance has a total resistance value of 4Rd. As a result, a voltage waveform represented by a dotted line of FIG. 4 may be obtained.

In an operating mode (or testing mode) requiring a load capacity about twice that of the initial mode, the first control signal TMEnable is high while the first complementary control signal /TMEnable is low, but the second and third control signals TMEnable2 and 3 are low while the second and third complementary control signals /TMEnable2 and 3 are high. Thus, a resulting damping resistance of 2Rd may be obtained. That is, the resistance value provided by damping resistance switching unit 21 is reduced by half to obtain a similar output characteristic for the driving voltage output as in the initial operating mode.

During an operating mode requiring a load capacity that is about four times greater than in the initial operating mode, the second control signal TMEnable2 is high while the second complementary control signal /TMEnable2 is low, the first complementary control signals TMEnable1 and /TMEnable2 are "DON'T CARE", and the third control signal TMEnable3 is low while the third complementary control signal /TMEnable3 is high. Thus, a damping resistance provided by damping resistance switching unit 21 has the total resistance value of Rd. That is, the resistance value is reduced to one-quarter of that obtained during the initial operating mode, yet it has the same output characteristic as the initial driving voltage output.

In an operating mode (i.e., a test mode) requiring a higher load capacity, the third control signal TMEnable3 is high while the third complementary control signal /TMEnable3 is low, and the first and second control signals TMEnable1 and 2 as well as the first and second complementary control signals /TMEnable1 and 2 are "DON'T CARE".

While the above-described embodiment has been described with respect to an operating mode wherein the driving voltage is a stepped voltage, a required constant driving voltage may be obtained by fixing the trimming signal and/or deleting the driving voltage trimming resistance 3 and the related trimming signal.

As set fourth above, there is provided a voltage regulator to obtain a required constant voltage or step voltage that effectively copes with mode-induced changes in a required load. For this reason, the voltage regulator may be applied to a wordline driving circuit of a NOR flash memory device. Although a load increases during a test mode (such as a GOING test at the end of a fabricating process), an internal program sequence may be used without changing normal mode loading conditions.

Embodiments of the invention may be applied to a nonvolatile memory device including a voltage regulator. Furthermore, embodiments of the invention may be applied to a nonvolatile memory device including a plurality of voltage regulators.

Figure 7:
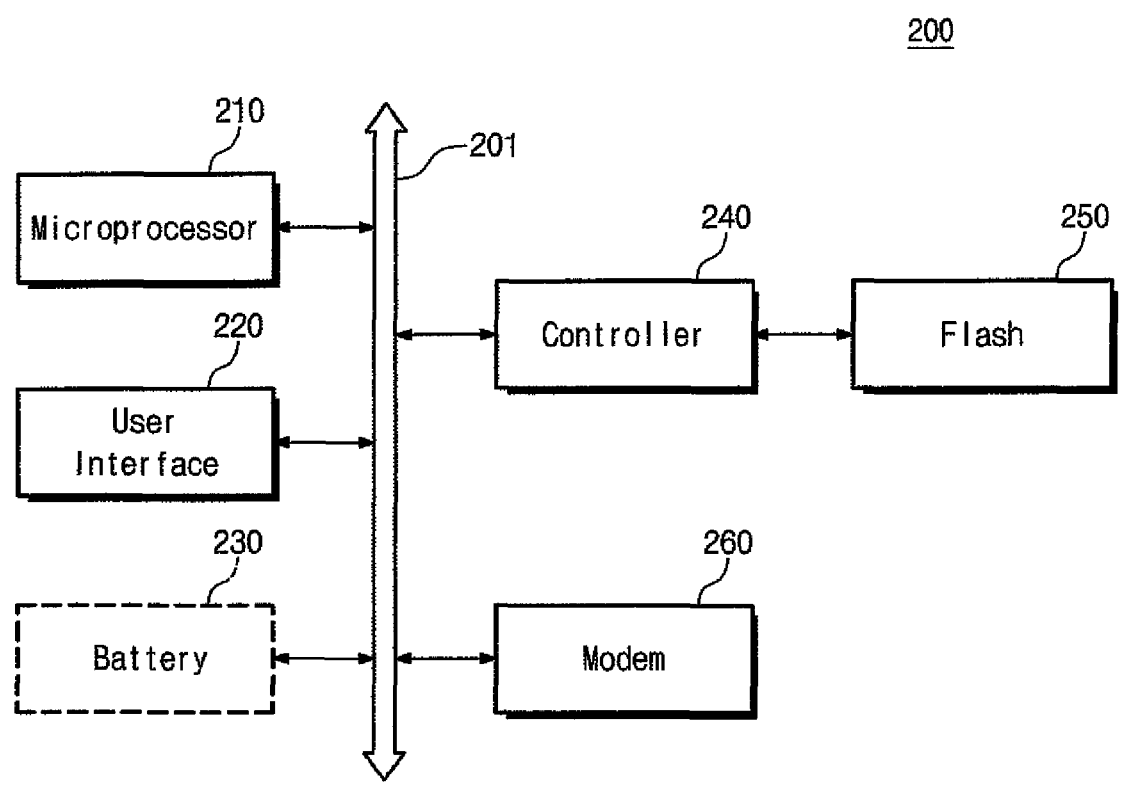
FIG. 7 is a block diagram of a computational logic system incorporating a flash memory device including a voltage regulator according to an embodiment of the invention.

A computational logic system 200 is schematically illustrated in FIG. 7. Computational logic system 200 includes a microprocessor 210, a user interface 220, a modem 260 such as a baseband chipset, a memory controller 240, and a flash memory device 250, which are electrically connected to one another. The flash memory device 260 may have the same configuration as that illustrated, for example, in FIGS. 1 and 2. N-bit data (where N is an integer of 1 or greater) processed or to be processed by the microprocessor 210 may be stored in flash memory device 250 using memory controller 240.

In the case where the computational logic system 200 is a mobile device, a battery 230 may be additionally provided to provide an operating voltage. Although not shown in the figure, it will be apparent to those skilled in the art that an application chipset, a camera image process (CIS), and a mobile DRAM may also be included in computational system 200. Memory controller 240 and flash memory 250 device may constitute, for example, a solid-state drive/disk (SSD) using a nonvolatile memory device to store data.

A flash memory device and/or a memory controller according to the present invention may be mounted using various packages such as, for example, PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), and so forth.

Although the present invention has been described in connection with the embodiment of the present invention illustrated in the accompanying drawings, it is not limited thereto. It will be apparent to those skilled in the art that various substitutions, modifications and changes may be made without departing from the scope spirit of the invention, as set forth in the attached claims.

What is claimed is:

1. A voltage regulator comprising:
a voltage regulator unit configured to output a stepped driving voltage at an output node; and
a damping resistance switching unit connected along a driving voltage path between a load and the output node of the voltage regulator unit, and configured to select a variable damping resistance value for the driving voltage path based on a required capacity for the load.

2. The voltage regulator of claim 1, wherein the voltage regulator unit comprises:
an operational amplifier;
a PMOS transistor including a source receiving a high voltage, a drain connected to an output node, and a gate receiving an output from the operational amplifier;
a trimming resistance connected between the output node and a connection node and having a resistance value that varies according to an applied trimming signal; and
a voltage setting resistance connected between the connection node and ground.

3. The voltage regulator of claim 1, wherein the damping voltage switching unit comprises:
a damping resistance connected along the driving voltage path and having a defined damping resistance value; and
a damping resistance bypass path connected in parallel with the driving voltage path and including a CMOS transistor switch comprising an NMOS transistor gated by a first control signal and a PMOS transistor gated by a second control signal, wherein the first and second control signals are complementary.

4. The voltage regulator of claim 3, wherein the voltage regulator is configured to operate in a first mode wherein the load requires a first capacity, and a second mode wherein the load requires a second capacity greater than the first capacity,
the first and second control signals switch OFF the CMOS transistor switch during the first mode to open the bypass connection path, and
the first and second control signals switch ON the CMOS transistor switch during the second mode to close the bypass connection path.

5. The voltage regulator of claim 1, wherein the first mode is a normal mode operating mode and the second mode is a test mode.

6. The voltage regulator of claim 1, wherein the damping resistance switching unit comprises:
a plurality of series connected damping resistances; and
a plurality of CMOS transistor switches respectively arranged in parallel across each one of the plurality of damping resistances.

7. A voltage regulator comprising:
a voltage regulator unit configured to output a stepped voltage at an output node; and
a damping resistance switching unit connected between a load and the output node of the voltage regulator unit, and configured to select a variable damping resistance value based on a required capacity for the load,
wherein the damping resistance switching unit comprises:
first, second and third damping resistances connected in series between the output node of the voltage regulator unit and the load, wherein the first damping resistance has a resistance value twice as great as either the second damping resistance or the third damping resistance;
a first CMOS transistor switch connected in parallel across the first damping resistance and comprising an NMOS transistor controlled by a first control signal and a PMOS transistor controlled by a first complementary control signal;
a second CMOS transistor switch connected in parallel across a series combination of the first and second damping resistances and comprising an NMOS transistor controlled by a second control signal and a PMOS transistor controlled by a second complementary control signal; and
a third CMOS transistor switch connected in parallel across a series combination of the first, second, and third damping resistances and comprising an NMOS transistor controlled by a third control signal and a PMOS transistor controlled by a third complementary control signal.

8. A flash memory device configured to operate in a first mode and a second mode and comprising a voltage regulator, wherein the voltage regulator comprises:
a voltage regulator unit configured to output via a driving voltage path a stepped driving voltage to a load having a first capacity during the first mode and a second capacity during the second mode greater than the first capacity; and
a damping resistance switching unit connected along the driving voltage path, and configured to apply a fixed damping resistance value to the driving voltage path during the first mode, and bypass the fixed damping resistance during the second mode.

9. The flash memory device of claim 8, wherein the voltage regulator unit comprises:
an operational amplifier;
a PMOS transistor including a source receiving a high voltage, a drain connected to an output node, and a gate receiving an output from the operational amplifier;
a trimming resistance connected between the output node and a connection node and having a resistance value that varies according to an applied trimming signal; and
a voltage setting resistance connected between the connection node and ground.

10. The flash memory device of claim 8, wherein the damping voltage switching unit comprises:

a damping resistance connected along the driving voltage path and having a defined damping resistance value; and a damping resistance bypass path connected in parallel with the driving voltage path and including a CMOS transistor switch comprising an NMOS transistor gated by a first control signal and a PMOS transistor gated by a second control signal, wherein the first and second control signals are complementary.

11. The flash memory device of claim 10, wherein the first mode is a normal operating mode for the flash memory device and the second mode is a testing mode for the flash memory device.

12. The flash memory device of claim 11, wherein the first and second control signals switch OFF the CMOS transistor switch during the normal operating mode to open the bypass connection path, and the first and second control signals switch ON the CMOS transistor switch during the testing mode to close the bypass connection path.

13. The flash memory device of claim 8, wherein the damping resistance switching unit comprises:

first, second and third damping resistances connected in series between the output node of the voltage regulator unit and the load, wherein the first damping resistance has a resistance value twice as great as either the second damping resistance or the third damping resistance;

a first CMOS transistor switch connected in parallel across the first damping resistance and comprising an NMOS transistor controlled by a first control signal and a PMOS transistor controlled by a first complementary control signal;

a second CMOS transistor switch connected in parallel across a series combination of the first and second damping resistances and comprising an NMOS transistor controlled by a second control signal and a PMOS transistor controlled by a second complementary control signal; and a third CMOS transistor switch connected in parallel across a series combination of the first, second, and third damping resistances and comprising an NMOS transistor controlled by a third control signal and a PMOS transistor controlled by a third complementary control signal.

14. The flash memory device of claim 8, wherein the damping resistance switching unit comprises:

a plurality of series connected damping resistances; and a plurality of CMOS transistor switches respectively arranged in parallel across each one of the plurality of damping resistances.

* * * * *